US006795745B1

(12) United States Patent
Ueno et al.

(10) Patent No.: US 6,795,745 B1
(45) Date of Patent: Sep. 21, 2004

(54) METHODS OF OPERATING VACUUM PROCESSING EQUIPMENT AND METHODS OF PROCESSING WAFERS

(75) Inventors: Tooru Ueno, Kumage (JP); Shigeru Nakamoto, Kudamatsu (JP); Shoji Okiguchi, Kudamatsu (JP); Hideki Yamasaki, Kudamatsu (JP); Kouji Nishihata, Tokuyama (JP)

(73) Assignee: Hitachi, Ltd., Tokyo (JP)

( * ) Notice: Subject to any disclaimer, the term of this patent is extended or adjusted under 35 U.S.C. 154(b) by 748 days.

(21) Appl. No.: 09/666,596

(22) Filed: Sep. 20, 2000

(30) Foreign Application Priority Data

Sep. 20, 1999 (JP) ............................................ 11-266245

(51) Int. Cl.⁷ .......................... G06F 19/00; H01L 21/00
(52) U.S. Cl. ............................ 700/121; 700/228; 438/5
(58) Field of Search ............................. 700/1–4, 11, 12, 700/117–121, 228; 34/92, 209, 217, 444; 438/5; 414/217

(56) References Cited

U.S. PATENT DOCUMENTS

| 5,024,570 A | * | 6/1991 | Kiriseko et al. | ....... 414/222.06 |
| 5,474,647 A | * | 12/1995 | Poultney et al. | ................ 438/5 |
| 5,864,485 A | * | 1/1999 | Hawthorne et al. | ......... 700/229 |
| 5,928,389 A | * | 7/1999 | Jevtic | ......................... 29/25.01 |
| 6,122,566 A | * | 9/2000 | Nguyen et al. | .............. 700/218 |
| 6,336,204 B1 | * | 1/2002 | Jevtic | ............................. 716/1 |
| 6,466,835 B1 | * | 10/2002 | Ishizawa et al. | ............ 700/112 |

FOREIGN PATENT DOCUMENTS

| JP | 63-133532 | 6/1988 |
| JP | 3-274746 | 12/1991 |
| JP | 11-67869 | 3/1999 |

\* cited by examiner

Primary Examiner—Maria N. Von Buhr
(74) Attorney, Agent, or Firm—Antonelli, Terry, Stout & Kraus, LLP

(57) ABSTRACT

A method of operating vacuum processing equipment that includes multiple sets of apparatus for performing a succession of different processes on individual wafers, an apparatus for transporting said wafers, and an apparatus for controlling said processing apparatus sets and said transport apparatus, and has at least two sets of wafer processing routes including multiple sets of said processing apparatus; wherein it is possible to judge whether each set of said processing apparatus for performing various processes is in a valid or invalid status for operation, to electrically disconnect only the processing apparatus whose operational status has been judged to be invalid, to reconstruct said processing routes by using the processing apparatus whose operational status has been judged to be valid, and to process said wafers by using only said processing apparatus which is valid for operation.

6 Claims, 14 Drawing Sheets

FIG. 3

| PROCESSING APPARATUS 1 | VALID : "1" , INVALID : "0" |
|---|---|
| PROCESSING APPARATUS 2 | VALID : "1" , INVALID : "0" |
| PROCESSING APPARATUS 3 | VALID : "1" , INVALID : "0" |
| PROCESSING APPARATUS 4 | VALID : "1" , INVALID : "0" |

FIG. 4

| FIRST STEP | CASSETTE |
|---|---|
| SECOND STEP | LOADING LOCK CHAMBER |
| THIRD STEP | PROCESSING APPARATUS 1 |
| FOURTH STEP | PROCESSING APPARATUS 2 |
| FIFTH STEP | PROCESSING APPARATUS 3 |
| SIXTH STEP | PROCESSING APPARATUS 4 |
| SEVENTH STEP | UNLOADING LOCK CHAMBER |
| EIGHTH STEP | CASSETTE |

FIG. 5

| ITEM \ MODE | 1-CASSETTE 1-RECIPE PARALLEL | 2-CASSETTE 1-RECIPE PARALLEL | 2-CASSETTE 2-RECIPE PARALLEL | 1-CASSETTE 1-RECIPE SERIAL |
|---|---|---|---|---|
| TRANSPORT ROUTES | ROUTE A (ETCHING CHAMBER) / ROUTE B (ASHING CHAMBER) | ROUTE C / ROUTE D | ROUTE C / ROUTE D | ROUTE E |
| PROCESSING OUTLINE | C1 PROCESSING, FOLLOWED BY C2 PROCESSING | C1/C2 SIMULTANEOUS PROCESSING WITH ONE RECIPE | C1/C2 SIMULTANEOUS PROCESSING WITH INDEPENDENT RECIPES | SERIAL PROCESSING OF TWO PROCESSING CHAMBERS |
| C1/C2 CASSETTE OPERATION | SEQUENTIAL PROCESSING | SIMULTANEOUS PROCESSING | SIMULTANEOUS PROCESSING | SEQUENTIAL PROCESSING |
| C1/C2 CASSETTE RECIPES | SAME RECIPE | SAME RECIPE | INDEPENDENT RECIPES | SAME RECIPE |
| TYPICAL PROCESSING | STANDARD | ← | VALID FOR FLEXIBLE MANUFACTURE | VALID FOR MULTILAYERED FILM ETCHING |
| TRANSPORT ROUTE ASSIGNMENT | POSSIBLE | POSSIBLE | POSSIBLE | POSSIBLE |

OPERATION BASED ON THE FIXED RELATIONSHIP BETWEEN CASSETTE AND PROCESSINGCHAMBER

TRANSPORT TO AN IDLE PROCESSING CHAMBER

FIG. 9

| PROCESSING CONDITIONS FOR UNFINISHED WAFERS |
|---|
| 1. PROCESSING IS CONTINUED BY RESTARTING IT FROM ITS INTERRUPTION TIME. |
| 2. ONLY THE WAFERS THAT HAVE CAUSED THE ERROR ARE PROCESSED WITH A RECOVERY RECIPE, AND SUBSEQUENT WAFERS ARE PROCESSED WITH THE ORIGINAL RECIPE. |
| 3. THE WAFERS THAT HAVE CAUSED THE ERROR ARE UNLOADED AND SUBSEQUENT WAFERS ARE LOADED FOR CONTINUED PROCESSING. |
| 4. THE WAFERS THAT HAVE CAUSED THE ERROR ARE UNLOADED AND RETURNED TO THE ORIGINAL CASSETTE, AND THEN THE PROCESSING ROUTE WHERE THE ERROR HAS OCCURRED IS ISOLATED FROM AUTOMATIC OPERATION TO CONTINUE PROCESSING. |
| 5. OPERATION IS ABORTED BY SELECTING MAINTENANCE MODE. |

TWO WAFERS TO UNDERGO AGING ARE SIMULTANEOUSLY
TRANSPORTED FOR THEIR PARALLEL AGING

METHODS OF OPERATING VACUUM PROCESSING EQUIPMENT AND METHODS OF PROCESSING WAFERS

BACKGROUND OF THE INVENTION

The present invention relates to methods of operating vacuum processing equipment, which comprises wafer processing apparatus and wafer transport apparatus used in the processing of wafers and having at least two sets of processing units, and to methods of processing wafers using such vacuum processing equipment.

An example of conventional vacuum processing equipment is shown in, for example, Japanese Application Patent Laid-open Publication No. Sho 63-133532 (1988). In the disclosed equipment, when samples are processed under the normal operational status of a system having wafer processing chambers connected to a wafer transport chamber, independent wafers can be simultaneously processed using independent processing chambers, or wafers can be sequentially processed via two or more processing chambers, and wafers can be transported for these purposes.

Another example of conventional vacuum processing relates to the methods of operating the equipment as shown in Japanese Application Patent Laid-Open Publication No. Hei-274746 (1991). In the disclosed methods, simultaneous processing is carried out via two routes, wherein maintenance operations are performed on the processing chamber included in one route and the processing chamber in the other route is transiently shared for twin-route processing.

Japanese Application Patent Laid-open Publication No. Hei-67869 (1999) discloses still another example of operating methods relating to vacuum processing equipment that comprises multiple sets of processing apparatus, wherein a means for generating operational information signals indicating whether the corresponding processing apparatus is valid or invalid for operation is provided in each set of processing apparatus, and means is provided for storing its operational information signals into memory, along with an apparatus control means by which the operation of the equipment, based on memory-stored operational information signals, can be continued by activating only a valid processing apparatus, without using any invalid processing apparatus.

The abovementioned vacuum processing equipment shown in Japanese Application Patent Laid-Open Publication No. Hei-133532 (1988) and Japanese Application Patent Laid-open Publication No. Hei-274746 (1991), does not allow for the case wherein, for reasons such as trouble, either processing chamber cannot be used during the operation of the equipment using at least two processing chambers as processing routes, with the result that operation must be executed to implement continued processing with only normal processing chambers or the appropriate corrective actions must be taken to recover the equipment from such abnormality. Nor does the abovementioned equipment allow for the operating methods or procedures that are to be applied to preferentially execute interruption processing by first stopping temporarily the operation that uses at least two processing chambers as processing routes, and then using as processing routes the processing chambers that have not been used as processing routes up to that time, and to resume the temporarily stopped operation.

The operating methods disclosed in Japanese Application Patent Laid-Open Publication No. Hei-67869 (1999) relate to vacuum processing equipment that comprises multiple sets of apparatus for performing a succession of different processes on individual wafers, apparatus for transporting said wafers, and apparatus for controlling said processing apparatus sets and said control apparatus, has at least two sets of wafer processing routes including said processing apparatus sets, and processes wafers by performing said processes in parallel. These operating methods include the method of and/or the procedure for operating the equipment by using a normal set of processing chambers if any processing chambers exist that require repair prior to the start of operation. However, even if one set of processing chambers includes normal processing chambers, all processing chambers constituting the set are electrically disconnected.

For example, if processing chambers of the same type are connected in the above case, the availability of the equipment is low since no consideration is given to an operating method that enables operation to be continued using only normal processing chambers.

Neither the cleaning process for removing foreign matter from the processing equipment nor the aging process to be executed prior to wafer processing in order for the inside of the processing equipment to be set up for processing wafers is taken into account in terms of improvement in availability.

SUMMARY OF THE INVENTION

One object of the present invention is to provide a vacuum processing equipment operating method and wafer processing method by which, during the operation of the vacuum processing equipment using at least two sets of processing apparatus, even if either processing chamber cannot be used for reasons such as trouble, the availability of the equipment can be improved using only normal processing chambers as processing routes, without being restrained by any relationship of the processing units that constitute two sets of processing apparatus.

Another object of the present invention is to provide a vacuum processing equipment operating method and wafer processing method that will also enable availability to be improved during both cleaning and aging processes.

In order to achieve the foregoing objects, the present invention provides a method of operating vacuum processing equipment comprising multiple sets of apparatus for performing a succession of different processes on individual wafers, an apparatus for transporting said wafers, and an apparatus for controlling said processing apparatus sets and said control apparatus, and having at least two sets of wafer processing routes including said processing apparatus sets; wherein, as one feature thereof, the abovementioned vacuum processing equipment operating method makes it possible to judge whether each set of said processing apparatus for performing various processes is in a valid or invalid status for operation, to electrically disconnect only the processing apparatus whose operational status has been judged to be invalid, to reconstruct said processing routes by using the processing apparatus whose operational status has been judged to be valid, and to process said wafers by using only said processing apparatus which are valid for operation.

Another feature of the present invention is that two of the multiple sets of processing apparatus mentioned above further includes a primary wafer processing unit (for example, an etching unit) and a secondary wafer processing unit (for example, a postprocessing unit). In such a case, it is judged whether the status of each such processing unit is valid or invalid for operation, and if the secondary processing unit in one set of processing apparatus is judged to be invalid for operation, only that secondary processing unit will be electrically disconnected, whereby two sets of processing routes for performing said successive processes will be reconstructed using two primary processing units and one valid secondary processing unit, and said wafers will be processed using said two sets of processing routes.

Still another feature of the present invention is that in the abovementioned method of operating the vacuum processing equipment comprising multiple sets of apparatus for performing a succession of different processes on individual wafers, an apparatus for transporting said wafers, and an apparatus for controlling said processing apparatus sets and said control apparatus, it is possible to judge whether each processing unit in each set of said processing apparatus for performing various processes is in a valid or invalid status for operation, to judge whether wafers remaining unfinished are present in each processing unit if it is judged to be invalid for operation, and to select either of multiple sets of previously registered processing conditions if unfinished wafers are judged to be present, thereby to process said unfinished wafers in accordance with the assigned processing conditions.

Still another feature of the present invention is that in the abovementioned method of operating the vacuum processing equipment comprising multiple sets of apparatus for performing a succession of different processes on individual wafers, an apparatus for transporting said wafers, and an apparatus for controlling said processing apparatus sets and said control apparatus, when automatic operation is to be started following the assignment of automatic operating conditions for performing said processes, it is possible to specify either the parallel processing routes intended to transport wafers after fixing multiple combinations of pairings between a cassette and a processing chamber, or the processing routes intended for transporting wafers to an idle processing chamber without fixing the relationship between a cassette and a processing chamber.

Still another feature of the present invention is that in the vacuum processing equipment operating method to be applied to process wafers using at least two sets of processing apparatus in an equipment arrangement comprising multiple sets of apparatus for processing said wafers, an apparatus for transporting said wafers, and an apparatus for controlling said processing apparatus sets and said transport apparatus, before the processing of the wafers in the aforementioned cassette is started, two dummy wafers are transported to two sets of processing apparatus and undergo parallel aging.

Still another feature of the present invention is that in the method of processing wafers by operating vacuum processing equipment comprising multiple sets of apparatus for performing a succession of different processes on individual wafers, an apparatus for transporting said wafers, and an apparatus for controlling said processing apparatus sets and said control apparatus, and having at least two sets of wafer processing routes including said processing apparatus sets, it is possible to judge whether each set of said processing apparatus for performing various processes is in a valid or invalid status for operation, to electrically disconnect only the processing apparatus whose operational status has been judged to be invalid, to reconstruct said processing routes by using the processing apparatus whose operational status has been judged to be valid, and to process said wafers by using only said processing apparatus valid for operation.

According to the present invention, it is possible to provide a vacuum processing equipment operating method and wafer processing method by which, during the operation of the vacuum processing equipment using at least two sets of processing apparatus, even if either processing chamber cannot be used for reasons such as trouble, the availability of the equipment can be improved using only normal processing chambers as processing routes, without being restrained by any relationship of the processing units that constitute two sets of processing apparatus.

The vacuum processing equipment operating method and wafer processing method that enable the availability of the equipment can also be provided for cleaning and aging processes.

BRIEF DESCRIPTION OF THE DRAWINGS

FIG. 3 is a table showing operational information of the unit control means in the vacuum processing equipment of FIG. 1.

FIG. 4 is a table showing the processing sequence information of the unit control means in the vacuum processing equipment of FIG. 1.

FIG. 5 is a table of the operation modes of the vacuum processing equipment shown in FIG. 1.

FIG. 9 is a table showing an example of unfinished-wafer processing conditions in the vacuum processing equipment of FIG. 1.

DETAILED DESCRIPTION OF PREFERRED EMBODIMENTS

One embodiment of the present invention will be described with reference to FIG. 1 to FIG. 5.

Figure 1:
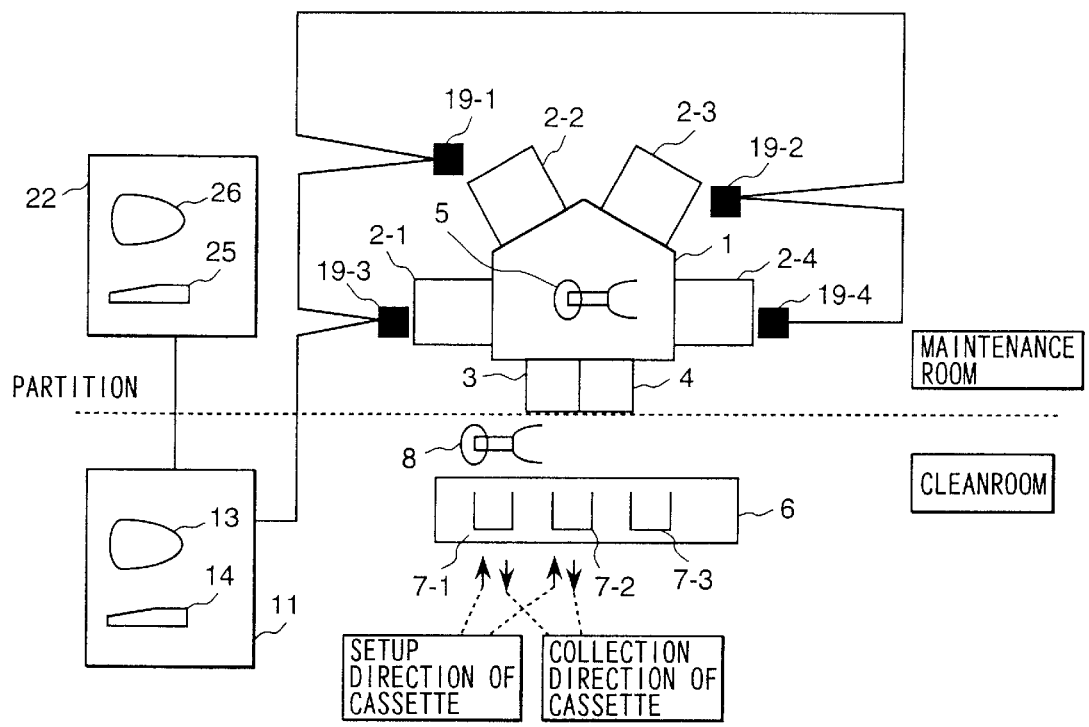
FIG. 1 is a schematic diagram showing one embodiment of vacuum processing equipment based on the present invention.

FIG. 1 is a block diagram showing an example of vacuum processing equipment representing one embodiment of the present invention. In the configuration of the vacuum processing equipment shown in this embodiment, processing units with four chambers in all are connected to one transport apparatus, cassettes for loading wafers into the processing units are installed in the atmospheric transport units located in front of the processing units, and wafers are taken out, one at a time, from the cassettes and then after being loaded into the processing units, the wafers undergo processing. More than four chambers can be connected to the processing units.

The units for processing wafers are shown as 2-1 to 2-4 in FIG. 1. Each of the processing units can be of either an etching, postprocessing, film-forming, sputtering, CDV, water-processing, or any other type, provided that it is for processing wafers. The wafer transport apparatus 1 transports wafers from loading lock chamber 3 to processing units 2-1 to 2-4 according to a predetermined wafer transport schedule, and then, after a wafer has undergone processing in one processing unit, it transports the wafer to the next processing unit. After the wafer has been provided with all necessary processing, this wafer is transported to unloading lock chamber 4.

Loading lock chamber 3 loads wafers from atmospheric transport unit 6 onto the transport apparatus, and unloading lock chamber 4 unloads wafers from the vacuum processing chambers onto atmospheric transport unit 6. Vacuum robot 5 located in the transport apparatus transports wafers. Atmospheric transport unit 6 is a unit in which multiple cassettes that contain wafers are to be set for transport, and the wafers to be processed or cleaned are stored within cassettes 7-1, 7-2, and 7-3 therein. Atmospheric robot 8 takes out wafers from the cassettes placed on atmospheric transport unit 6 and then carries the wafers into loading lock chamber 3 or returns the wafers within unloading lock chamber 4 to the respective cassettes. Main control unit 11 for controlling the entire equipment has display means 13 and input means 14. The operator uses display means 13 and input means 14 to give operational starting instructions after setting the operating conditions for main control unit 11.

Operational information signal generating means 19-1 to 19-4 serves to generate operational information signals indicating whether processing units 2-1 to 2-4 are valid or invalid for operation. These means, although located in the processing units, can be provided anywhere in the vacuum processing equipment.

Maintenance operations on the vacuum processing equipment can be performed using display means 26 and input means 25 located in auxiliary operations panel 22. Auxiliary operations panel 22 is a held-hand operating terminal (for example, a note-type personal computer) and can be carried close to the vacuum processing equipment. While visually checking equipment status, therefore, the operator can perform maintenance operations using the unit information displayed at display means 26, such as input/output or ON/OFF information and error information, and can thus improve the ease of operations in maintenance. Although provided with the same function as main control unit 11, auxiliary operations panel 22 is also provided with a misoperations preventing function so that if an attempt is made to simultaneously operate both main control unit 11 and the auxiliary operations panel 22, only either one can be operated to ensure safety for the operator.

Figure 2:
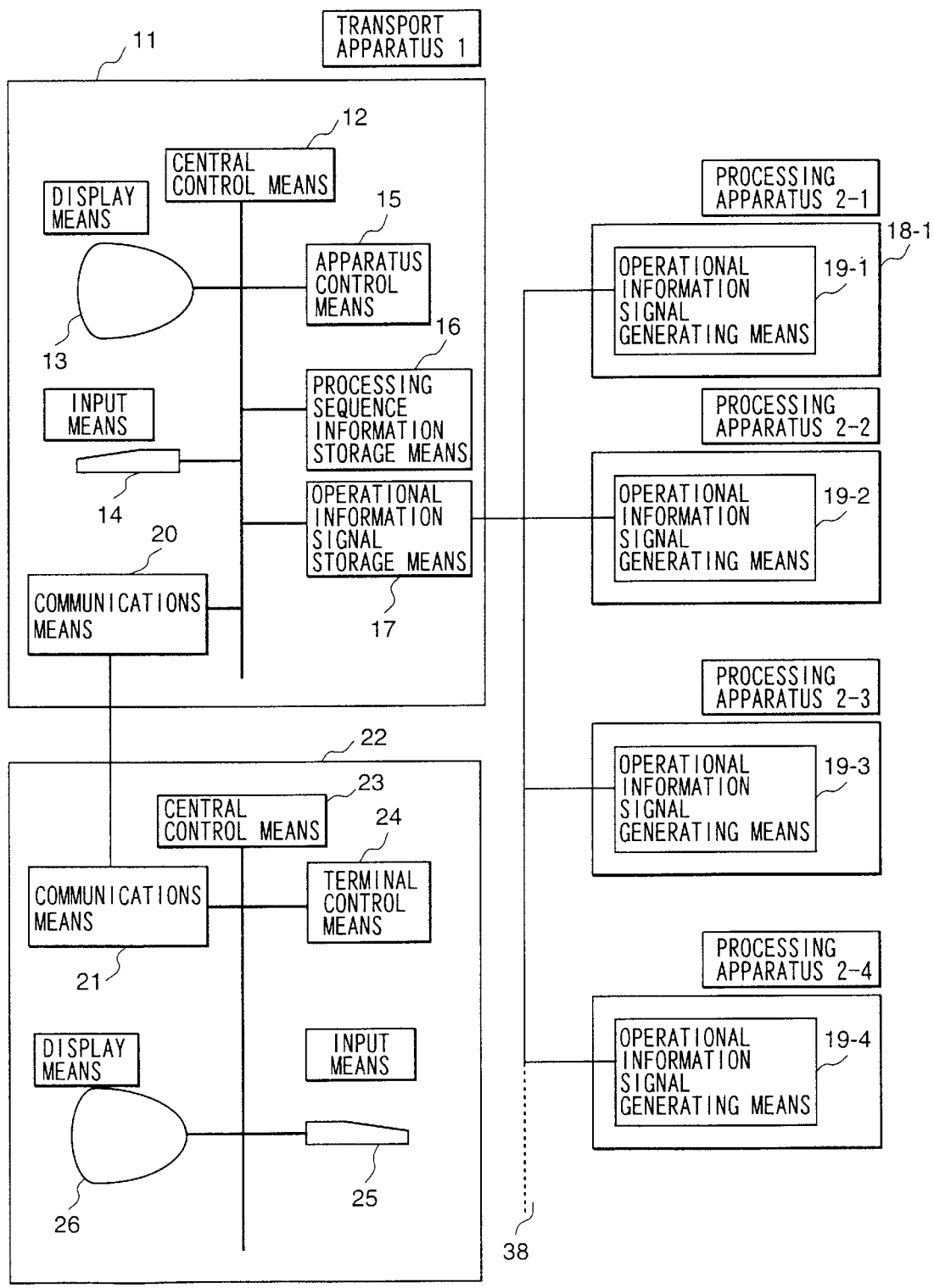
FIG. 2 is a block diagram of the unit control means in the vacuum processing equipment of FIG. 1.

FIG. 2 is a block diagram of the control apparatus shown in this embodiment. This embodiment shows the case in which main control unit 11 for controlling the entire equipment is mounted in transport apparatus 1. In this embodiment, only control means related to features of the present invention are described and the input/output control portions (DI/0, AI/0) required for equipment operations are not described. Main control unit 11 does not always need to be mounted in transport apparatus 1. Also, display means 13 and input means 14 can be included as the components of a control unit different from main control unit 11.

Central control means 12 is, for example, a central processor unit (CPU). A means 13 for displaying the operational status of the equipment, the settings of operating conditions, and starting/stopping instructions for operation is, for example, a cathode-ray tube (CRT) display monitor. A means 14 for the assignment of operating conditions and input of operation starting instructions, processing conditions, and maintenance operations information is, for example, a keyboard. A means 16 for storing the wafer processing sequence in the vacuum processing equipment is, for example, a random access memory (RAM). Data that has been entered by the operator using display means 13 and input means 14 prior to the start of operation is stored into the memory as a wafer processing sequence. A means 17 for storing the operational information signals indicating whether processing units 2-1 to 2-4 are valid or invalid for operation is, for example, a RAM.

Unit control means 15 judges the operational information signal status indicating whether processing units 2-1 to 2-4 are valid or invalid for operation, and even if one of the four processing units 2-1 to 2-4 is invalid for operation, this unit control-means stores the processing procedure that enables valid processing units to be used to continue operation without using that invalid processing unit. Means 15 is, for example, a read-only memory (ROM). Means 13 to 17 mentioned above are controlled by central control means 12.

Operational information signal generating means 19-1 to 19-4 can be replaced by:

1) Using the apparatus power interruption signal source of the processing apparatus, or 2) Using the operation valid/invalid select signal source (for example, select switch) of the processing apparatus, or 3) Using the input information entered by the operator as the operational control signal indicating whether the processing apparatus is valid or invalid for operation.

Communications means 20 and 21 are provided for connecting main control unit 11 and auxiliary operations panel 22. Auxiliary operations panel 22, and elements 25 and 26 are used for the aforementioned purposes. Terminal control means 24 stores the processing sequence that controls terminal functions via the auxiliary operations panels. Central control means 23 controls the aforementioned sections 21, 24, 25, and 26, and is, for example, a central-processor unit (CPU).

Under normal operating conditions, cassette 7-1 (or 7-2) that contains product wafers, and cassette 7-3 that contains cleaning wafers are placed on atmospheric transport unit 6 by the operator. The start of operation is specified after operating conditions have been assigned using display means 13 and input means 14. When operation is started, wafers are transported to processing units 2-1 to 2-4, where the wafers then undergo processing and are returned to their original cassettes. After all wafers within the original cassettes have undergone processing, a buzzer not shown in the corresponding figure starts sounding to advise the operator that the cassettes are to be collected, and the operator removes the cassettes.

After processing of the cassettes containing product wafers, the cleaning wafers within cassette 7-3 are unloaded into processing units 2-1 to 2-4, where the wafers are then used for processing and then are returned to cassette 7-3.

In this case, cleaning can likewise be executed after transporting one cleaning-use dummy wafer to four processing units 2-1, 2-2, 2-3, and 2-4, in that order, or simultaneous cleaning can also be executed after transporting one cleaning-use dummy wafer into each of the four processing units. Although, during the abovementioned cleaning processes, on completion of processing for the cassettes containing product wafers, the cleaning-use dummy wafers within cassette 7-3 are unloaded into processing units 2-1 to 2-4, and then they are used for processing, although cleaning can likewise be executed without transporting any cleaning-use dummy wafer to processing units 2-1 to 2-4.

In addition to the above method in which cleaning can be accomplished after all product wafers within one cassette have undergone processing, cleaning is likewise possible after dummy wafers for cleaning have been unloaded from cassette 7-3 into processing units 2-1 to 2-4 for each number of product wafers which underwent processing during one cleaning cycle (this number of wafers can be specified as appropriate). Or, cleaning is also possible without unloading any cleaning-use dummy wafer from cassette 7-3 into processing units 2-1 to 2-4 for each number of product wafers which underwent processing during one cleaning cycle (this number of wafers can be specified as appropriate). Or, cleaning is also possible by unloading cleaning-use dummy wafers from cassette 7-3 into processing units 2-1 to 2-4 after the previously set number of cassettes which contain product wafers have undergone processing.

Next, prior to the start of processing for the cassettes containing product wafers, these wafers can also undergo processing after aging without transporting any dummy wafer from cassette 7-3 into processing units 2-1 to 2-4. Or, prior to the start of processing for the cassettes containing product wafers, after dummy wafers have been transported from cassette 7-3 into processing units 2-1 to 2-4, undergone aging, and are returned to cassette 7-3, the previously set number of product wafers can also undergo aging, followed by required processing.

During the assignment of processing routes, which form part of the operating conditions required, the processing units to be used for the corresponding processes are specified by respective unit identification codes so that each unit operates in accordance with the wafer processing sequence.

FIG. 3 is a signal diagram of the operational information shown in this example. Information that indicates valid/invalid operational status is stored for each processing unit. In this case, although valid status and invalid status are shown as 1 and 0, respectively, any other codes or numerals can also be used, provided that these codes or numerals enable status distinction. The above information denotes the signal status of operational information signal generating means 19-1 to 19-4 and is stored into operational information signal storage means 17.

FIG. 4 shows processing sequence information for this example. The processing sequence information refers to the wafer processing sequence specified as part of the operating conditions by the operator using display means 13 and input means 14 before operation is started. The processing sequence information is stored into a processing sequence information storage means.

An example of the wafer processing sequence mentioned above is shown as an operation mode in FIG. 5.

The description of this operation mode, given hereunder, assumes that processing units 2-2 and 2-3 perform the same process (in this embodiment. etching) and that processing units 2-1 and 2-4 perform the same process (in this embodiment. postprocessing). Also, this example of processing assumes that etching with processing unit 2-2 or 2-3 is followed by postprocessing with processing unit 2-1 or 2-4. In addition, description is given below of a cleaning operation where, after processing of the product wafers contained in one cassette, the cleaning-use wafers within cassette 7-3 are transported from processing unit 2-3 (or 2-2) to processing unit 2-4 (or 2-1) and then cleaning occurs.

The present invention, however, is not limited to the operation mode shown in FIG. 5, and can be applied to etching only, if permitted by the wafer processing conditions. Also, processing units 2-2 and 2-3 and processing units 2-1 and 2-4 can perform any combination of processes between processes such as etching, postprocessing, film forming, sputtering, CVD, and water processing, provided that the processes are intended for wafer processing. The number of processing chambers to be used to perform the same process does not need to be limited to the number shown in the embodiment.

1) 1-Cassette 1-Recipe Parallel Operation

The cassette-contained wafers to undergo processing under the same conditions (hereinafter, one set of processing conditions is referred to as a recipe) ate taken out from the cassette in order, with the top or bottom wafer being first, and then they are carried into the transport apparatus, and undergo processing. The wafers are processed using both route A, through which the wafers are to undergo etching in processing unit 2-2 and then after undergoing postprocessing in processing unit 2-3, these wafers are to be returned to the original cassette, and route B, through which the wafers are to undergo etching in processing unit 2-3 and then after undergoing postprocessing in processing unit 2-4, these wafers are to be returned to the original cassette.

In this embodiment, the processing sequence takes this route combination:

Route A: Cassette 7-1→Processing unit 2-2→Processing unit 2-1→Cassette 7-1

Route B: Cassette 7-1→Processing unit 2-3→Processing unit 2-4→Cassette 7-1

The following route combination, however, can be used instead:

Route C: Cassette 7-1→Processing unit 2-2→Processing unit 2-4→Cassette 7-1

Route D: Cassette 7-1→Processing unit 2-3→Processing unit 2-1→Cassette 7-1

During wafer processing, each wafer within the cassette undergoes processing in the sequence of the first wafer following route A, the second Following route B, the third following route A, the fourth following route B, and so on up to the last wafer.

Figure 6:
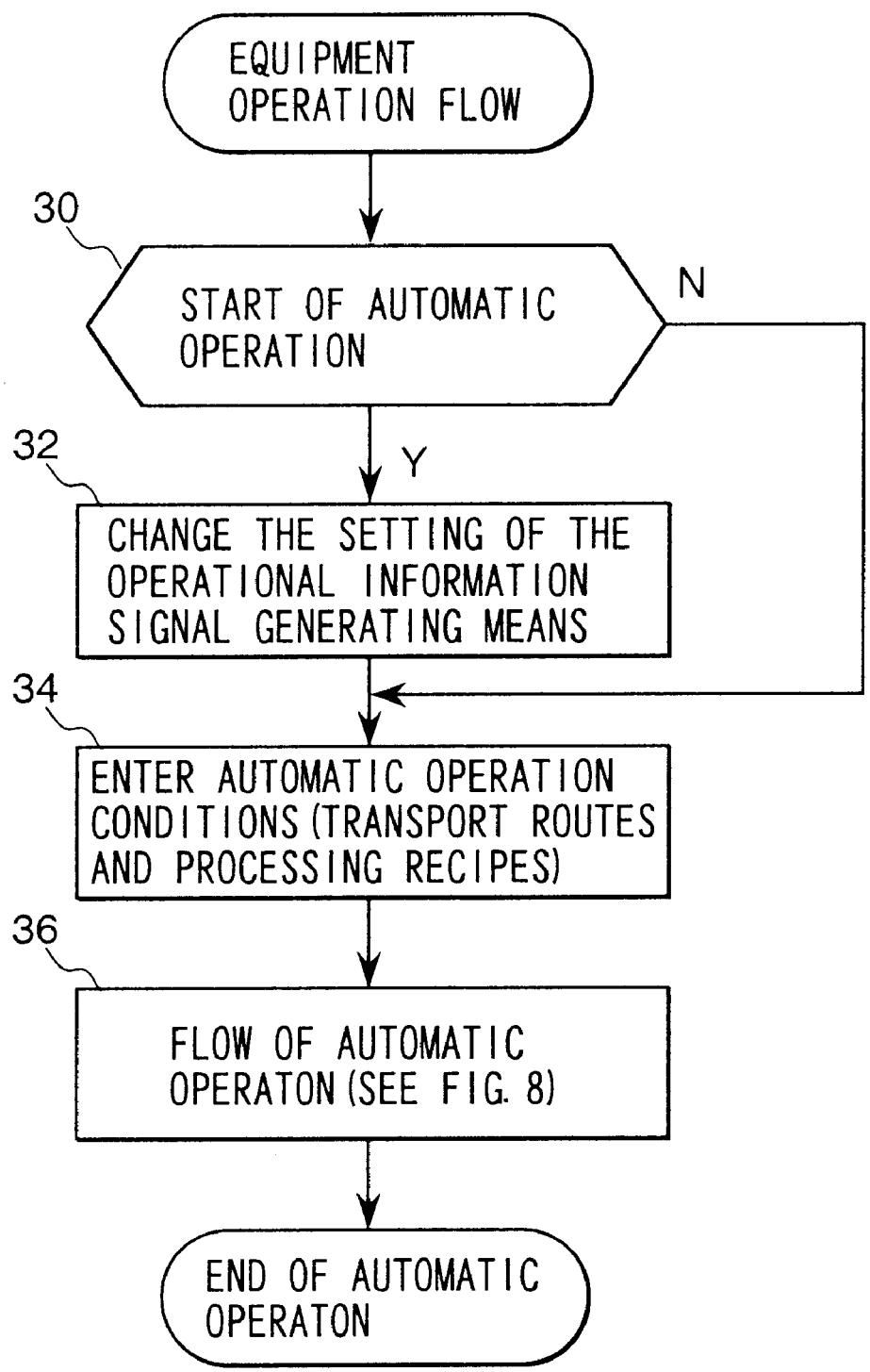
FIG. 6 is an automatic operation flow diagram of the unit control means in the vacuum processing equipment of FIG. 1.

FIG. 6 is a flow diagram of the equipment operation shown in this embodiment. Before starting the processing equipment, the operator judges whether the processing equipment has any processing units that cannot be operated for reasons such as trouble, or that are not to be operated for reasons such as maintenance (plasma cleaning included). This phase is shown as 30. If a processing unit is detected that cannot be operated or that is not to be operated, operational information signal generating means 19 is to be used to set that processing unit to the status shown in FIG. 3. This phase is shown as 32. Methods of setting the processing unit to the required status are by:

1) Turning off the solenoid power switch of the processing unit if its power interruption signal is to be used. Thus, the interruption signal is generated and transmitted to operational information signal storage means 17, where the signal is then stored as the information shown in FIG. 3.

2) Setting the assigned operation select signal source (for example, select switch) of the processing unit to a valid or invalid state if the select signal is to be used to select whether the processing unit is to be activated. Thus, the select signal status is made firm and transmitted to operational information signal storage means 17, where the signal is then stored as the information shown in FIG. 3.

3) Entering from input means 14 the information settings that have been assigned to the processing unit, if the information that has been entered by the operator is to be used as the operational control signal indicating whether the processing unit can be operated. Thus, the information settings are made firm and transmitted to operational information signal storage means 17, where the settings are then stored as the information shown in FIG. 3. After the unit connection configuration has been determined, automatic operating conditions are assigned (34) and then automatic operation is started (36).

During automatic operating conditions assignment (34), the wafer processing sequence is set as part of the product processing conditions, as follows:

1) The operation mode for wafer processing is selected.

Either "1-cassette 1-recipe parallel", "2-cassette 1-recipe parallel", "2-cassette 2-recipe parallel", or "1-cassette 1-recipe serial" is selected.

2) The wafer transport routes are specified.

For each cassette, either parallel or serial wafer processing routes are specified using the identification codes of the processing units to be operated. Typical examples of specification are shown below. (Wafer processing routes can be combined as described earlier in this SPECIFICATION.)

2-1) Parallel processing
Cassette 7-1: E1→A1, Cassette 7-1: E2→A2
Cassette 7-2: E1→A1, Cassette 7-2: E2→A2
E1: Processing unit 2-2, E2: Processing unit 2-3
A1: Processing unit 2-1, A2: Processing unit 2-4
2-2) Serial processing
Cassette 7-1: E1→E2→A1
Cassette 7-2: E2→E1→A 3) Processing conditions (also referred to as process recipes) are specified for each processing chamber.

Figure 7A:
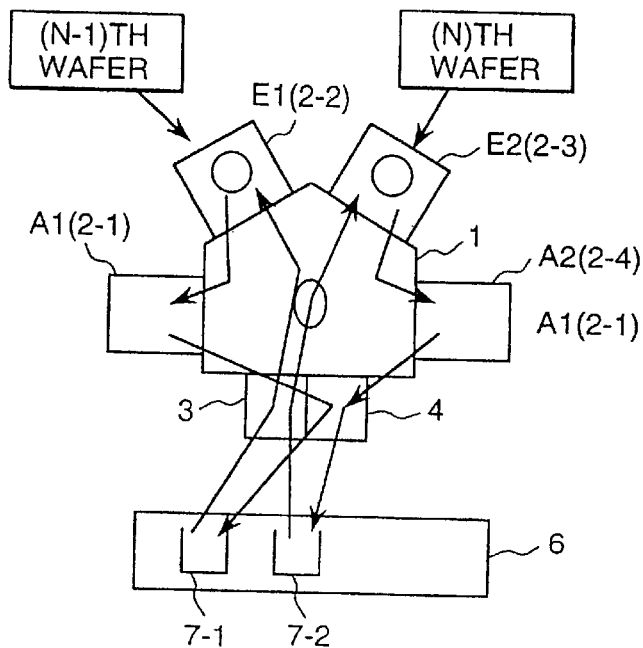
FIGS. 7A and 7B are diagrams of the route assignment methods in the vacuum processing equipment shown in FIG. 1.
Figure 7B:
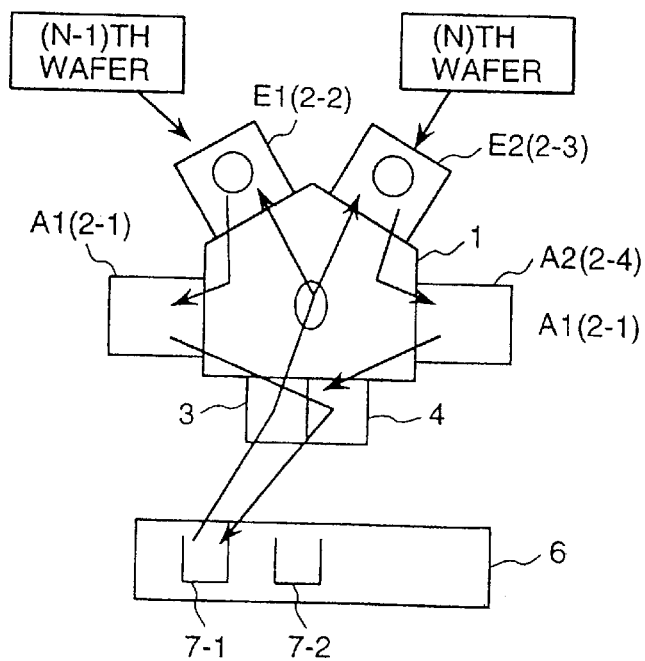

FIGS. 7A and 7B show an example of the method of specifying the wafer transport routes as an example of automatic operating conditions assignment (34). FIG. 7A shows parallel processing in which wafers are to be transported with two sets of fixed pairing between a cassette and a processing chamber. FIG. 7B shows the case wherein wafers are to be transported to an idle processing chamber without the pairing of a cassette and processing chamber being fixed.

During the assignment of automatic operating conditions, if no processing routes are specified, data can be entered so that processing routes including the pairing of the processing unit to execute wafer etching and processing unit to execute wafer postprocessing so as to function as the set of processing units that performs a succession of different processes will be automatically set.

Also, in one or two sets of pairing between the processing unit to execute wafer etching and the processing unit to execute wafer postprocessing, the processing unit to be used with each processing cycle can be switched to another processing unit to make the degree of wear on each processing unit as uniform as possible.

After product processing conditions have been set in this way, automatic operation is started (36).

Figure 8:
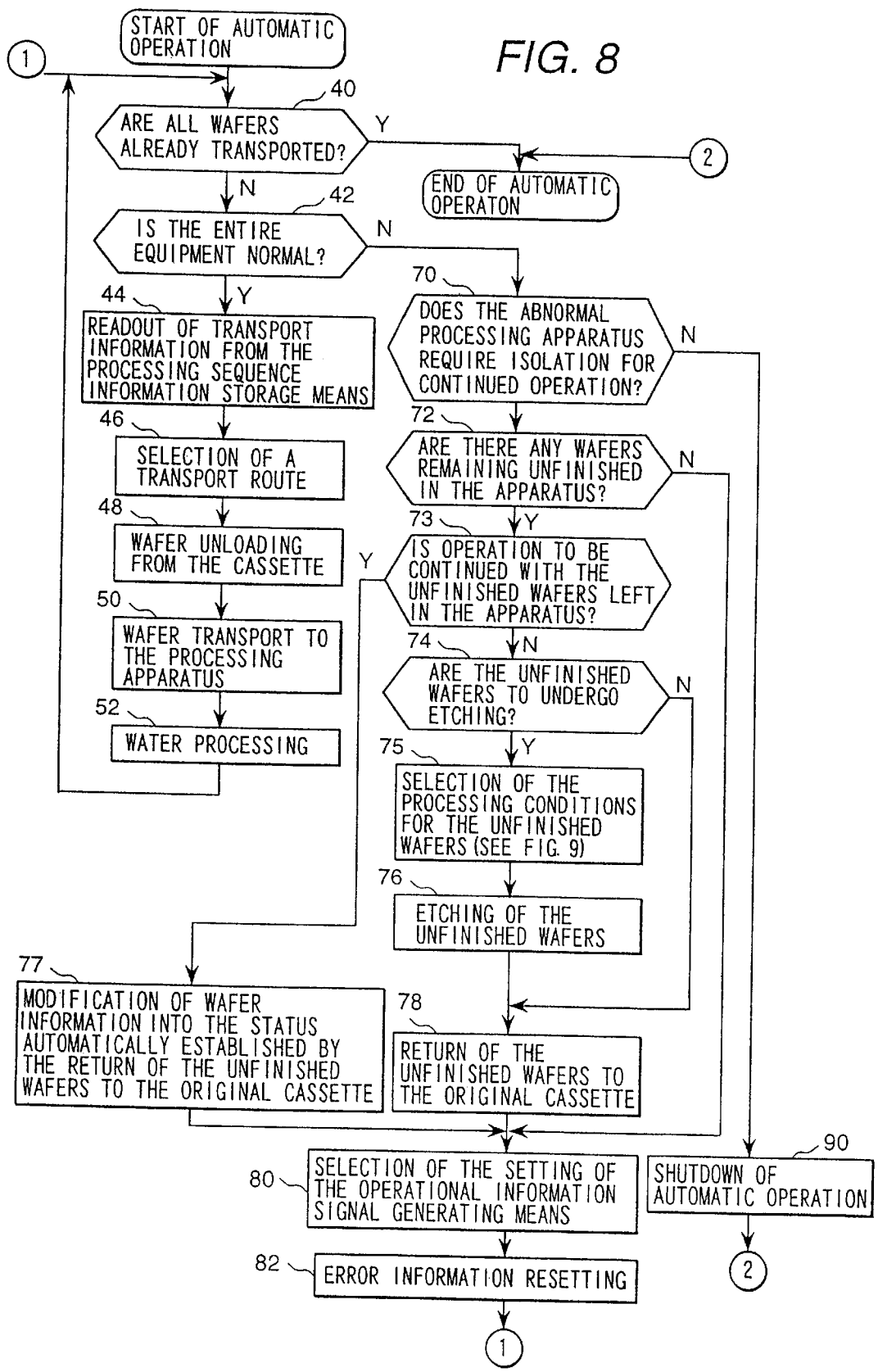
FIG. 8 is a detailed flow diagram of the automatic operation flow shown in FIG. 6.

FIG. 8 is a flow diagram of the automatic operation shown in this embodiment. When automatic operation is started, whether all the wafers to be processed have been transported are judged and if all the wafers have been transported, processing is completed. If any wafers remain yet to be transported, processing advances to automatic operation (40). Whether some trouble has occurred during automatic operation to interrupt this operation mode is judged (42). If no trouble has been detected, operation is continued (processing advances to phase 44). If there are any processing units that cannot be operated, whether the operation can be continued without using the corresponding processing units is judged by the operator (70). If the operation cannot be continued, when the operator specifies cancellation of the automatic operation mode, the equipment stops the automatic operation mode (90). Even if the operation can be continued, a wafer may remain either in the processing unit, on the hand of the vacuum robot, or in the loading lock chamber or the unloading lock chamber.

An example of processing the wafers remaining in the processing unit is shown below. First, whether wafers actually remain in the processing unit is judged (72). Next, whether the operation is to be continued with the wafers remaining in the processing unit is judged (73).

That is, the operator selects either method (1) or method (2) below.

(1) Continuing the operation with the wafers remaining in the processing unit.

(2) Instead of continuing the operation with the wafers remaining in the processing unit, taking the necessary action and restarting the operation. This method must be selected to enable automatic operation to be restarted from its interrupted status and then to be continued. If this method is selected, since the schedule for transporting and processing all of the wafers within the processing unit has already been made firm by the time some trouble has occurred during automatic operation, unless the wafers in the unit that has encountered the trouble are returned to cassette 7 from which these wafers were removed, their transport and processing schedule will be disturbed, which will not enable interrupted automatic operation to be restarted and continued.

If operation is to be continued with the wafers remaining in the processing unit, the wafer information is modified (77) into a status emulating a condition wherein the corresponding wafers were returned to the original cassette. In other words, instead of returning the wafers remaining in the unit that has encountered the trouble to the original cassette, leaving the wafers in the unit as they are, the operator modifies the wafer information into a status emulating a condition wherein the corresponding wafers were returned to the original cassette. For example, this method is used when, after leaving the wafers in a troubled unit as they are, and modifying the wafer information as if the corresponding wafers were returned to the original cassette, there is a need to complete the processing of semi-finished wafers as a group (as one lot) by restarting and continuing automatic operation from its interrupted status, then terminate automatic operation, and return the wafers remaining in the processing unit to the original cassette. Another example of this embodiment is also possible, in which, after the wafers remaining in the unit that has encountered the trouble have been left as they are, instead of being returned to the original cassette, the processing of semi-finished wafers is to be completed as a group (as one lot) by restarting and continuing automatic operation from its interrupted status, then automatic operation is to be terminated, and the wafers remaining in the processing unit are to be returned to the original cassette.

if operation is to be discontinued with the wafers remaining in the processing unit, which of these wafers is to undergo etching is judged (74).

If etching is required, the processing conditions for the corresponding wafer are selected (75). For example, as shown in FIG. 9, five sets of such processing conditions are provided beforehand:

(1) Continuing processing by retrying it from its interruption time.

(2) Using a recovery recipe to process only the abnormal wafer, and using the original recipe to continue processing from the next wafer onward.

3) Continuing processing by unloading the abnormal wafer first and then loading the next wafer.

(4) Continuing processing by unloading the abnormal wafer into the original cassette first and then disconnecting the abnormal processing route from automatic operation.

(5) Interrupting operation by selecting the maintenance mode.

Attention is returned to FIG. 8. If trouble occurs during the etching of any wafer left in the processing chamber, the etching of the remaining wafers is executed (76) and then each wafer is returned to the original cassette (78).

The above operation is conducted to minimize damage to the wafers. If a wafer remains either on the hand of the vacuum robot or in the loading lock chamber or unloading lock chamber, this wafer is to be returned to the original cassette (78) by performing independent operations on each unit (lock chamber exhaust/leak operations and/or wafer transport).

As described above, after the wafers in the troubled unit have been provided with the necessary measures and then returned to the original cassette, interrupted automatic operation is resumed. Thus, tracking information on the wafers that were left in the troubled unit (processing chamber or vacuum robot) becomes equivalent to information on the wafers processed through normal routes, and, as a result, automatic operation can be restarted. After these measures have been taken for the wafers that remained in the processing unit, the select operations (80) of the same operational information signal generating means as those shown in (32) of FIG. 6 are performed on processing units not to be used. Trouble information is then reset (82) in order to continue automatic operation.

Under a normal operational status, the next-wafer transport route information within processing sequence information storage means 16 is read out (44) and then matched to the information stored within operational information signal storage means 17 so as to determine the transport routes (46). The determined transport routes can be provided with transport route data for each wafer that is to be taken out from the cassette, or it is also allowed to create a processing sequence information table different from the information within processing sequence information storage means 16 and then to access this table when the wafers are transported. Once the transport routes have been determined, atmospheric robot 8 carries a wafer out from cassette 7 as step 48, then transports the wafer to the processing unit registered in the determined transport route information as step 50, and the wafer undergoes processing (52). If wafer transport or processing becomes abnormal, the respective processes that can be continued to ensure continued automatic operation are executed to completion and then automatic operation is interrupted. For example, during the etching of the Nth wafer, the etching process is continued until it has been completed, and automatic operation is interrupted at the time of completion of etching. If, during wafer transport by vacuum robot 5, trouble occurs in other processes, vacuum robot 5 interrupts automatic operation after completing wafer transport to the required location. Subsequently after memory storage of the trouble information (not shown in the corresponding figure) that indicates that trouble has occurred, information indicating to the operator that the unit has been interrupted is displayed at display means 13 and at the same time, a buzzer not shown in the figure is sounded. After this, processing returns to step 42, from which it then progresses in accordance with the required sequence.

Figure 10:
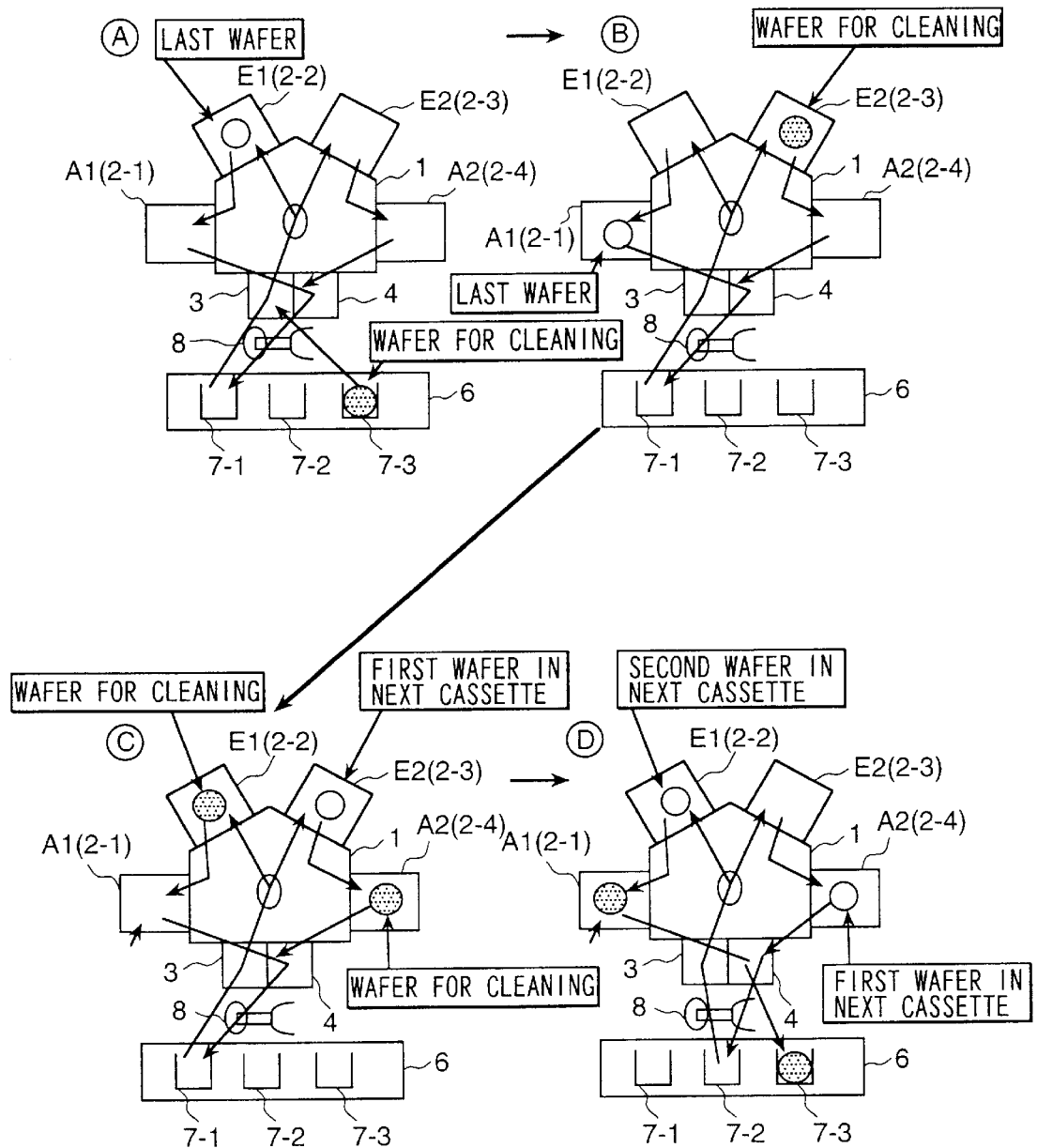
FIG. 10 is a flow diagram of a cleaning operation based on the present invention.

Next, the flow of the cleaning operation based on the present invention will be explained with reference to FIG. 10. After the last wafer has been carried into cassette 7-1, a cleaning wafer is carried from cassette 7-3 into loading lock chamber 3, as shown in FIG. 10 at A. After that, if the last wafer in processing unit 2-2 has already been transported to processing unit 2-1, the cleaning wafer is transported to processing unit 2-2 and cleaning is started (see FIG. 10 at B).

After cleaning in processing unit 2-3, the cleaning wafer is transported from processing unit 2-3 to processing unit 2-4 and cleaning is started. If cassette 7-1 for the next product wafers has been set by this time, the second product wafer is transported from cassette 7-1 to processing unit 2-2 and undergoes processing. After cleaning in processing unit 2-4, the cleaning wafer is returned to loading lock chamber 4 (see FIG. 10 at C). Also, after all the wafers within cassette 7-1 have undergone processing, a buzzer not shown in this figure is sounded to notify to the operator-that processing for cassette 7-1 his been completed and that the cassette requires replacement. After completion of cassette 7-1, cassette 7-2 undergoes processing. Furthermore, after cleaning in processing unit 2-2, the cleaning wafer is transported from processing unit 2-2 to processing unit 2-1 and cleaning is started. After cleaning, the cleaning wafer is returned to cassette 7-3.

In this way, cassette 7-2 also undergoes processing in the same sequence as that of cassette 7-1, and after all the wafers within cassette 7-2 have undergone processing, a buzzer not shown in this figure is sounded to notify the operator that processing for cassette 7-2 has been completed and that the cassette requires replacement. See FIG. 10 at D.

Hereafter, the above operation cycle is repeated. This operation cycle is completed when the operations for stopping it are performed from main control unit 11.

The following five modes are available to complete processing:

a) Wafer loading stop: Removal of wafers from the cassette currently undergoing processing is stopped. (If two cassettes are handled as one lot during operation, removal of wafers from the specified cassette is stopped.)

b) Cassette loading stop: After all the wafers within the cassette currently undergoing processing have been processed, processing for the cassette that has been set there up to that time is stopped.

(If two cassettes are handled as one lot during operation, all the wafers within the specified cassette have been processed, processing for the cassette that has been set there up to that time is stopped.)

c) Cycle stop: The cycle is stopped immediately after completion of the currently ongoing process, exhaust, leak, transport, and other operations.

d) Processing chamber halt: The specified processing chamber is temporarily deactivated after completion of the currently ongoing process. In this case, operation can be restarted from its interrupted status by performing the required restart operations. Also, only the particular processing chamber can be manually operated.

e) Immediate stop: All ongoing processes are stopped immediately.

Any method can be used to complete processing.

2) 2-Cassette 1-Recipe Parallel Operation

The cassette-contained wafers to undergo processing under the same conditions (recipe) are taken out from the cassette, in order with the bottom or top wafer being first, and then they are carried into the transport apparatus, and undergo processing. In this case, the operation where the wafers are taken out from the cassette, then transported to the transport apparatus, and undergo processing, differs from the case of "1-cassette 1-recipe parallel operation" described above.

During "1-cassette 1-recipe parallel operation", after wafers have been sequentially taken out from the cassette, then transported to the transport apparatus, and undergone processing, all the wafers within that cassette undergo processing and then the wafers within the next cassette undergo processing. During "2-cassette 1-recipe parallel operation", however, wafers are taken out alternately from cassettes 7-1 and 7-2, then carried to the transport apparatus, and undergo processing. As with "1-cassette 1-recipe parallel operation", during "2-cassette 1-recipe parallel operation", wafers are processed using both route A, through which the wafers are to undergo etching in processing unit 2-2 and then after undergoing postprocessing in processing unit 2-1, these wafers are to be returned to the original cassette, and route B, through which the wafers are to undergo etching in processing unit 2-3-and then after undergoing postprocessing in processing unit 2-4, these wafers are to be returned to the original cassette.

The combination of routes A and B or C and D in the processing sequence shown in this embodiment are the same as for "1-cassette 1-recipe parallel operation".

During wafer processing, each wafer within the two cassettes undergoes processing in the sequence of the 7-1 cassette's first wafer as the first following route A, the 7-2 cassette's first wafer as the second following route B, the 7-1 cassette's second wafer as the third following route A, the 7-2 cassette's second wafer as the fourth following route B, and so on up to the last wafer. After all the wafers within cassette 7-1 or 7-2 have undergone processing, a buzzer not shown in this figure is sounded to notify the operator that processing for the cassette has been completed and that the cassette requires replacement.

Until this cassette has been removed and a new one set, only processing for the other cassette is continued. When a new cassette is set, wafers are taken out alternately from cassettes 7-1 and 7-2, then carried to the transport apparatus, and undergo processing, as described earlier. Hereafter, the above operation cycle is repeated. This operation cycle is completed when the operations for stopping it are performed from main control unit 11. The method of completing the operation cycle is the same is for "1-cassette 1-recipe parallel operation". Also, cleaning is the same as for item 1) above.

3) 2-Cassette 2-Recipe Parallel Operation

In this operation mode, since the wafer processing recipe differs between cassettes 7-1 and 7-2, the processing time in the processing units may differ. In this case, removal of wafers from cassettes 7-1 and 7-2 is not alternate; this operation mode is the same as "2-cassette 1-recipe parallel operation", except that after processing in one processing unit has been finished and the wafer has been transported to the next processing unit, the next wafer is carried to the corresponding processing unit.

4) 1-Cassette 1-Recipe Serial Operation

This operation mode is the same as "1-cassette 1-recipe parallel operation" in that the cassette-contained wafers to undergo processing under the same conditions (recipe) are taken out from the cassette, in order with the bottom or top wafer being first, and then they are carried into the transport apparatus, and undergo processing. The wafer processing routes, however, differ from those of "1-cassette 1-recipe parallel operation". In the "1-cassette 1-recipe serial operation" mode, each wafer, after undergoing etching in processing unit 2-2 (or 2-3) first and then processing unit 2-3 (or 2-2), undergoes postprocessing in processing unit 2-1 (or 2-4) and is returned to the original cassette. This processing route is referred to as route E.

During wafer processing, each wafer undergoes processing in the sequence of the first wafer following route E, the second wafer following route E, the third wafer following route E, the fourth wafer following route E, and so on up to the last wafer. After all the wafers within cassette 7-1 have undergone processing, a buzzer not shown in this figure is sounded to notify the operator that processing for the cassette has been completed and that the cassette requires replacement.

If cassette 7-2 has been set by this time, processing advances to cassette 7-2 following completion of processing for cassette 7-1. Cassette 7-2 also undergoes processing in the same sequence as that of cassette 7-1, and after all the wafers within cassette 7-2 have undergone processing, a buzzer not shown in this figure is sounded to notify the operator that processing for the cassette 7-2 has been completed and that the cassette requires replacement. If cassette 7-1 has been set by this time, processing advances to cassette 7-1 following completion of processing for cassette 7-2. Hereafter, the above operation cycle is repeated. This operation cycle is completed when the operations for stopping it are performed from main control unit 11. The method of completing the operation cycle is the same as for "1-cassette 1-recipe parallel operation". Also, cleaning is the same as for item 1) above.

The operating methods described in items 1) to 4) above relate to typical cases. Since other operating methods are also possible by making cassette/recipe and parallel/serial operation combinations different from those described in the above items, the present invention is not limited to the four operating methods.

Figure 11:
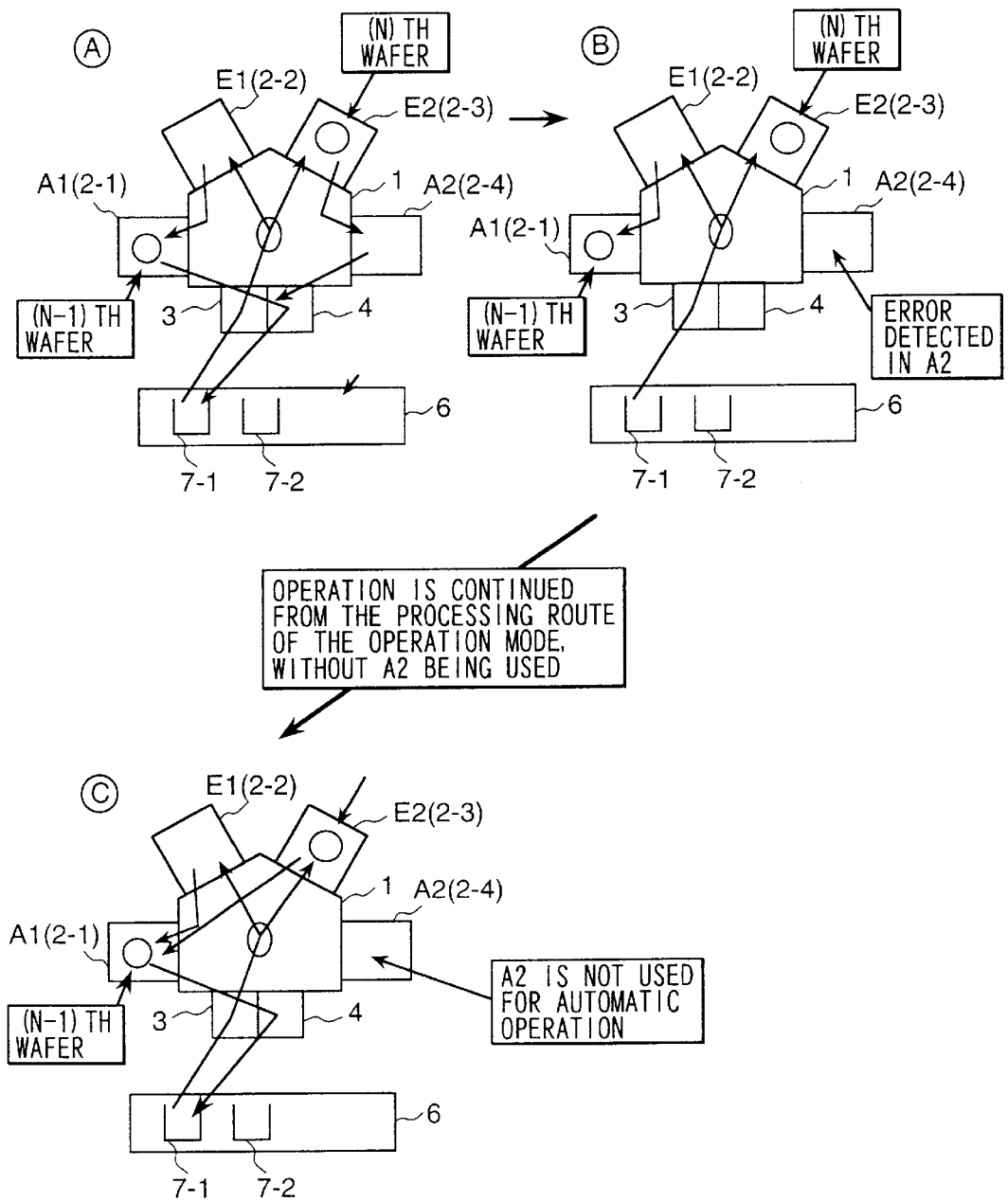
FIG. 11 is a sequence diagram of on-trouble transport route changing in the vacuum processing equipment shown in FIG. 1.

FIG. 11 is a sequence diagram of automatic route changing after the occurrence of trouble. Symbol A in FIG. 11 is for the "1-cassette 1-recipe parallel operation" operation mode shown in FIG. 5, and the wafer transport routes in this operation mode are as follows:

Cassette 7-1: E1→A1 and E2→A2

Cassette 7-2: E1→A1 and E2→A2 where if, as shown in B of FIG. 11, trouble occurs in A2 during the etching of the (N)th wafer in E2 and the postprocessing of the (N−1)th wafer in A1, operation is continued from the processing routes onward of the operation mode, without A2 being used. That is, as shown in C of FIG. 11, wafer postprocessing is always executed in A1.

Operation using the following routes is possible:

Cassette 7-1: E1→A1 and E2→A1

Cassette 7-2: E1→A1 and E2→A1

According to this embodiment, decreases in on-trouble efficiency can be minimized since, even if trouble occurs in either one of the two processing chambers paired to establish 1-recipe operation, new transport routes are automatically constructed by canceling the pairing and then combining the valid processing chamber of that pair and the processing chambers of any other pair.

For example, if the processing chamber that has encountered trouble is a postprocessing chamber and the time required for postprocessing is half the etching time, the use of any two normal processing chambers and one normal postprocessing chamber enables processing to be continued without practically affecting the total processing time.

If the processing unit in one set of processing units that is to undertake etching and the processing unit in another set of processing units that is to undertake postprocessing are judged to be invalid for operation, it is also allowed to disconnect the invalid processing units, then reconstruct one set of processing routes by using the normal postprocessing unit of one processing unit set and the normal etching unit of the other processing unit set in order to perform a succession of processes, and process said wafers using this set of processing routes.

Figure 12:
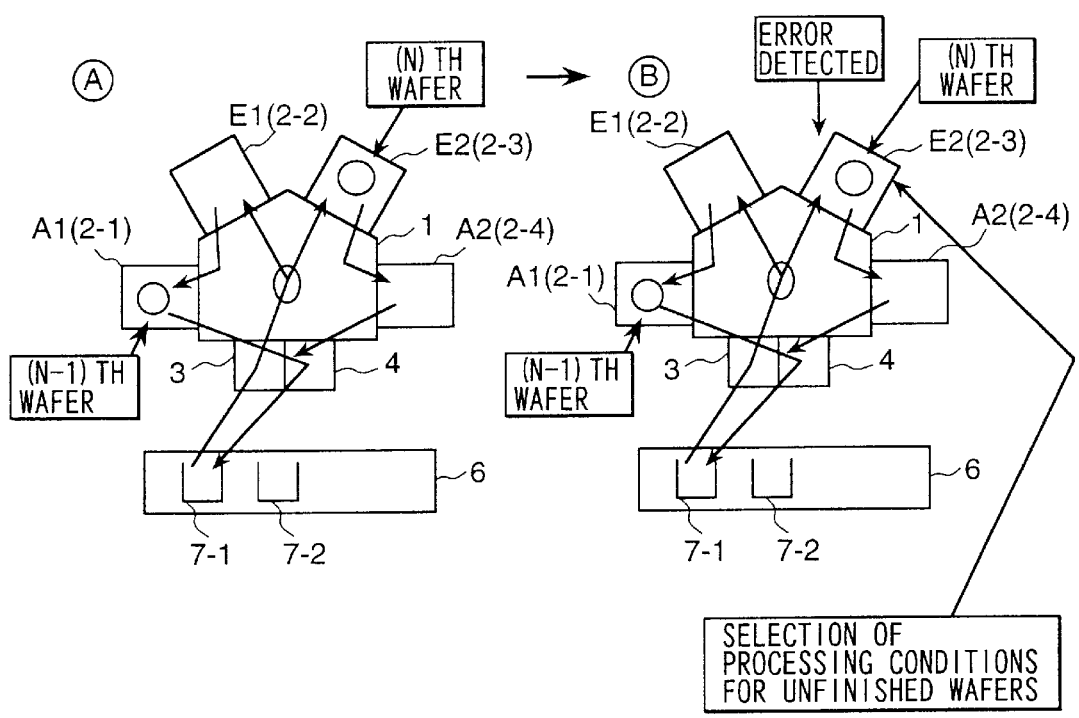
FIG. 12 is a sequence diagram showing the retry status of a recovery recipe in the vacuum processing equipment of FIG. 1.

FIG. 12 is a diagram illustrating the retry of the recovery recipe. Part A in FIG. 12 relates to the "1-cassette 1-recipe parallel operation" operation mode shown in FIG. 5. As shown in part B of FIG. 12, if trouble occurs in processing chamber E2, the operator selects either set of processing conditions for the wafers remaining unfinished and retries the recipe as follows:

(1) Continuing processing by retrying it from its interruption time.

(2) Using a recovery recipe to process only the abnormal wafer, and using the original recipe to continue processing from the next wafer onward.

(3) Continuing processing by unloading the abnormal wafer first-and then loading the next wafer.

(4) Continuing processing by unloading the abnormal wafer into the original cassette first and then disconnecting the abnormal processing route from automatic operation.

(5) Interrupting operation by selecting the maintenance mode.

As explained above, in the event of trouble, processing is not mechanical; depending on the type of trouble, the operator can select the appropriate set of processing conditions for the unfinished wafers, and thus, the appropriate recovery measure can be adopted according to the particular status of the equipment.

It is desirable that the maximum allowable amount of information on the status of the vacuum processing equipment should be displayed at display means 13 and 26 in order to aid the operator in judging in the event of trouble.

The processing conditions that can be selected for the wafers remaining unfinished are not limited to the five types listed above and can be modified as required.

Figure 13:
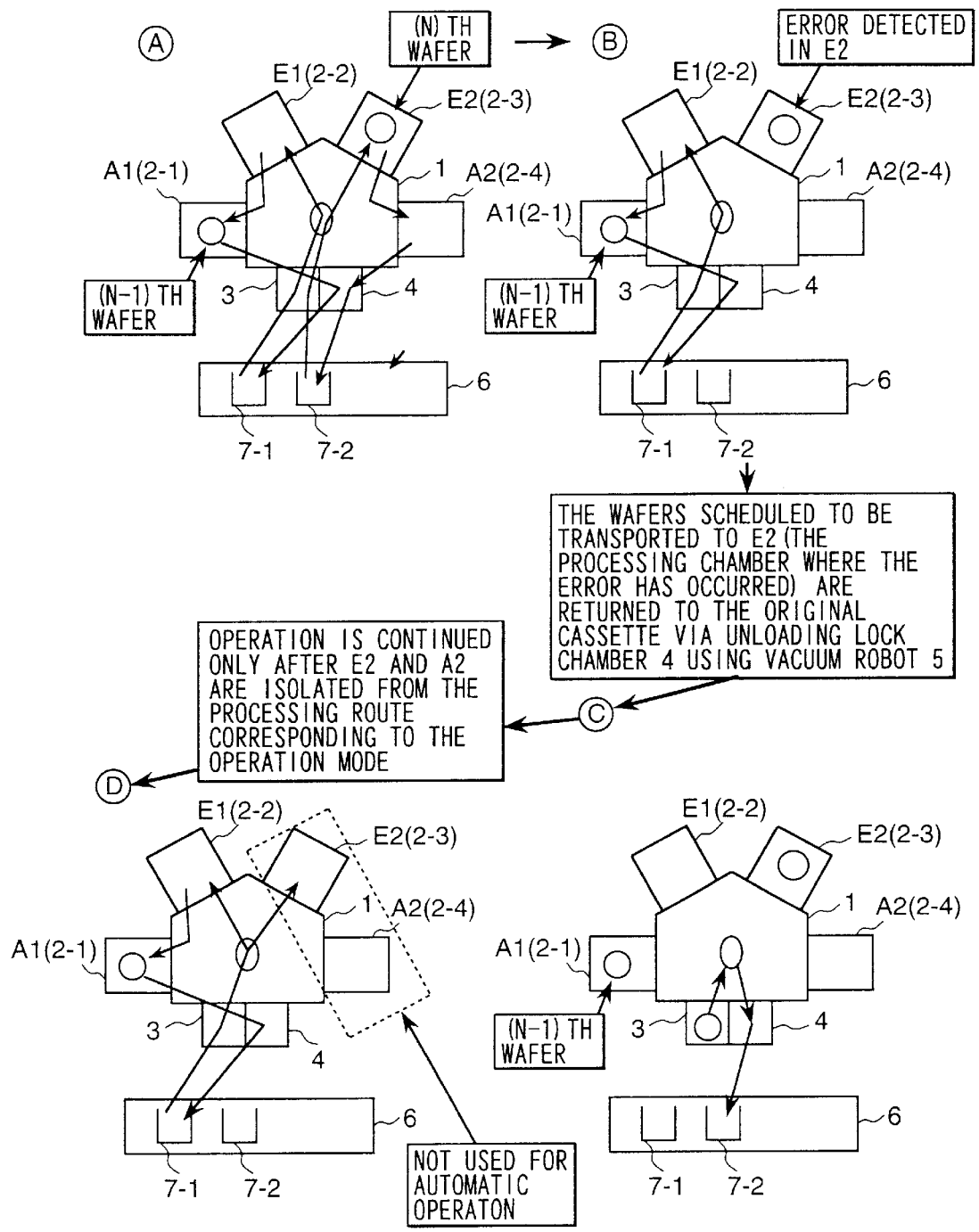
FIG. 13 is a sequence diagram showing the collection status of unnecessary wafers during parallel processing in the vacuum processing equipment of FIG. 1.

FIG. 13 is a diagram that illustrates the collection of the wafers that have become unnecessary because of trouble occurring in A2 during parallel processing. Part A in FIG. 13 relates to the "1-cassette 1-recipe parallel operation" operation mode shown in FIG. 5. In part B of FIG. 13, the wafers scheduled to be carried from cassette 7-1 to the processing chamber E2 that has encountered the trouble are returned to cassette 7-1 via unloading lock chamber 4 by vacuum robot 5. This state is shown in part C of FIG. 13. After that, as shown in part D of FIG. 13, processing chambers E2 and A2 are disconnected from the processing routes corresponding to the operation mode, and then operation is continued.

Figure 14:
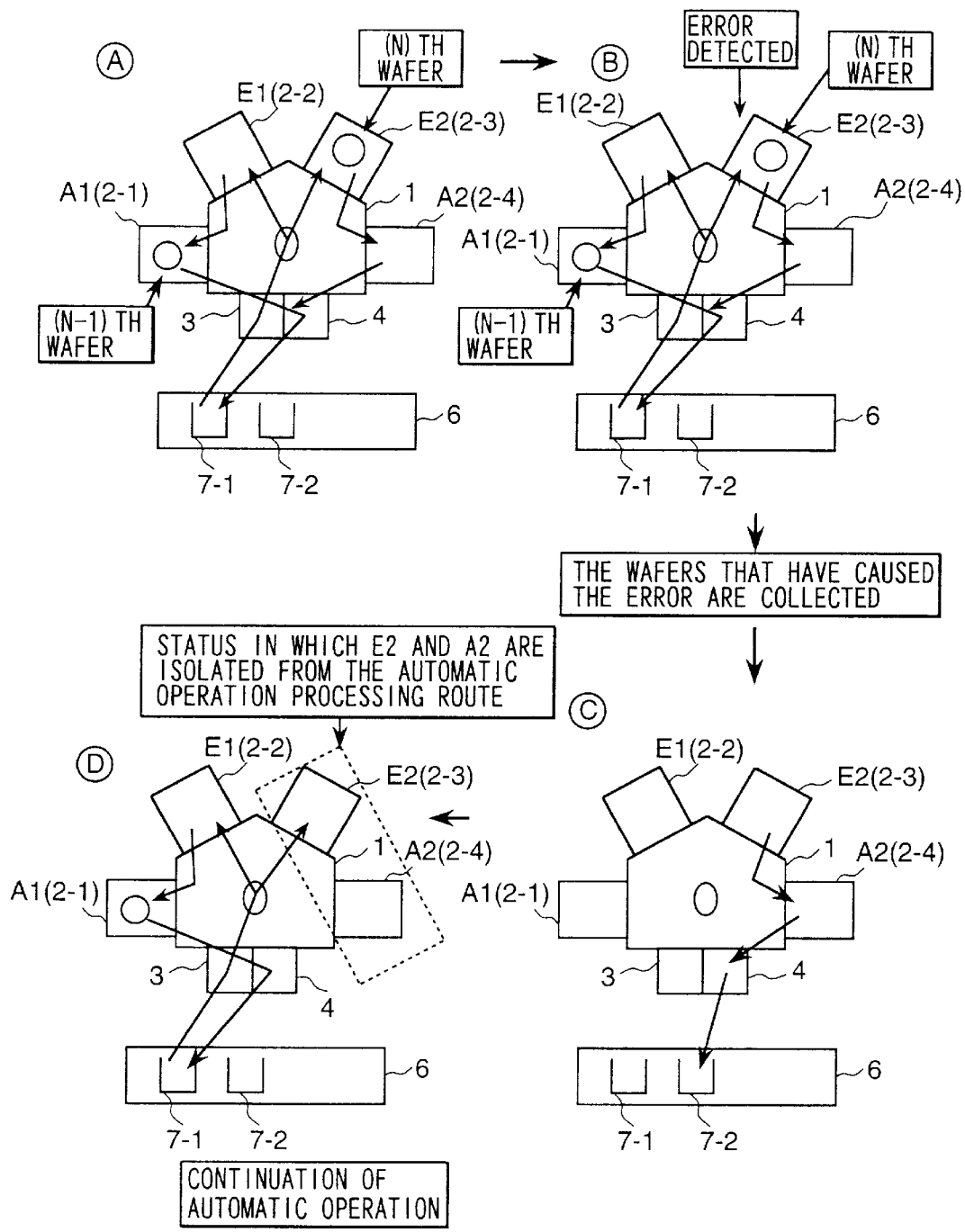
FIG. 14 is a sequence diagram showing the return of automatic operation from the maintenance mode in the vacuum processing equipment of FIG. 1.

FIG. 14 is a sequence diagram that illustrates the return of automatic operation from the maintenance mode. Part A in FIG. 14 relates to the "1-cassette 1-recipe parallel operation" operation mode shown in FIG. 5, and the wafer transport routes in this operation mode are as follows:

Cassette 7-1: E1→A1 and E2→A2

Cassette 7-2: E1→A1 and E2→A2 where, as shown in part B of FIG. 14, it is assumed that trouble occurs in processing chamber E2 during the etching of the (N)th wafer in E2 and the postprocessing of the (N–1)th wafer in A1. Under this state, etching is completed, and after the postprocessing of the (N–1)th wafer in A1 has ended, automatic operation is interrupted without the (N–1)th wafer being carried out to unloading lock chamber 4.

After that, as shown in part C of FIG. 14, the wafer in processing chamber E2 where the trouble occurred is collected into cassette 7-2. For E2 and A2, the select operations that use the operational information signal generating means shown in FIG. 8 are performed as step 80, thus setting the operational information of processing unit 4 (A2) to "Invalid: 0", as shown in FIG. 3. Subsequently, the trouble information is reset (see step 82 in FIG. 8) and automatic operation is continued.

After the restart of operation, as shown in part D of FIG. 14, the (N–1)th wafer in A2 is carried to unloading lock chamber 4 and subsequent operation is continued from the processing routes of the operation mode, without E2 or A2 being used.

Next, operations for starting the processing unit 4 (A2) whose operational information was set to "Invalid: 0" can be performed using auxiliary operations panel 22 in order to investigate the cause of the trouble. For example, wafer push-up operations inside processing unit 4 (A2), not shown in the figure, can be performed for the purpose of operational confirmation.

Execution of these operations enables the cause of the trouble to be removed, and thus the processing unit 4 (A2) whose operational information was set to "Invalid: 0" can be returned to the wafer processing routes.

Although, in the above embodiment, E2 and A2 during automatic operation are disconnected from the automatic operation processing routes by issuing a stop instruction under the equipment stop operations, the stopping instruction can likewise be issued using the detector function contained in the processing equipment. For example, the same function as the equipment stopping operations can be executed by activating the foreign substance monitoring unit built into the processing equipment. More specifically, when the fact that the foreign substance measurement monitoring data sent from the foreign substance monitoring unit has exceeded the value that was entered prior to operation is detected, the corresponding signal can be used to issue the stopping instruction to both E2 and A2 during automatic operation and thus to stop the equipment.

Figure 15A:
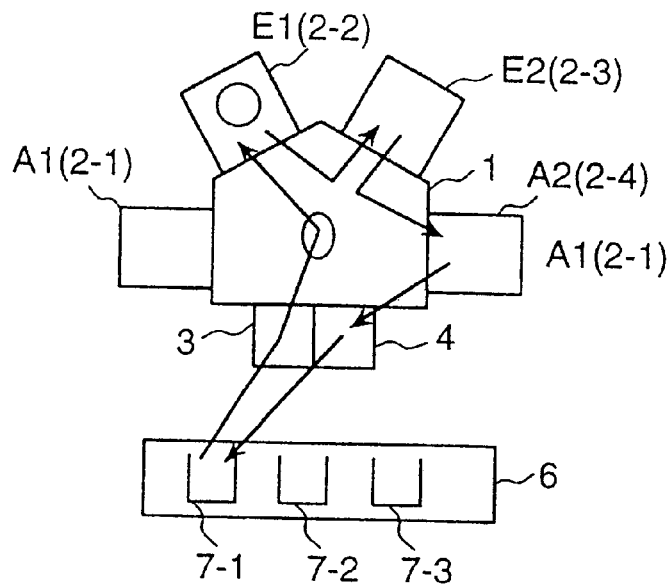
FIGS. 15A and 15B are diagrams showing the status of serial aging based on the present invention.
Figure 15B:
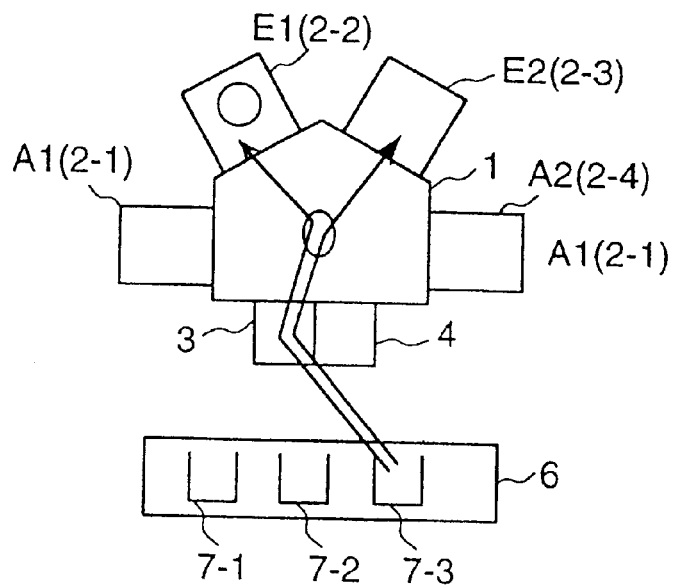

FIGS. 15A and 15B are diagrams illustrating is an explanatory diagram of serial aging. Wafers can be continuously carried, one at a time, to undergo serial aging, as shown in FIG. 15A, or two wafers can be carried at the same time to undergo parallel aging, as shown in FIG. 15B. Parallel aging reduces the aging time.

As described so far, according to the corresponding embodiment of the present invention, it is possible for processing to be executed using idle processing chambers during automatic operation, and it is also possible to execute one-side operation in which any operations can be performed on idle processing chambers only.

Figure 16:
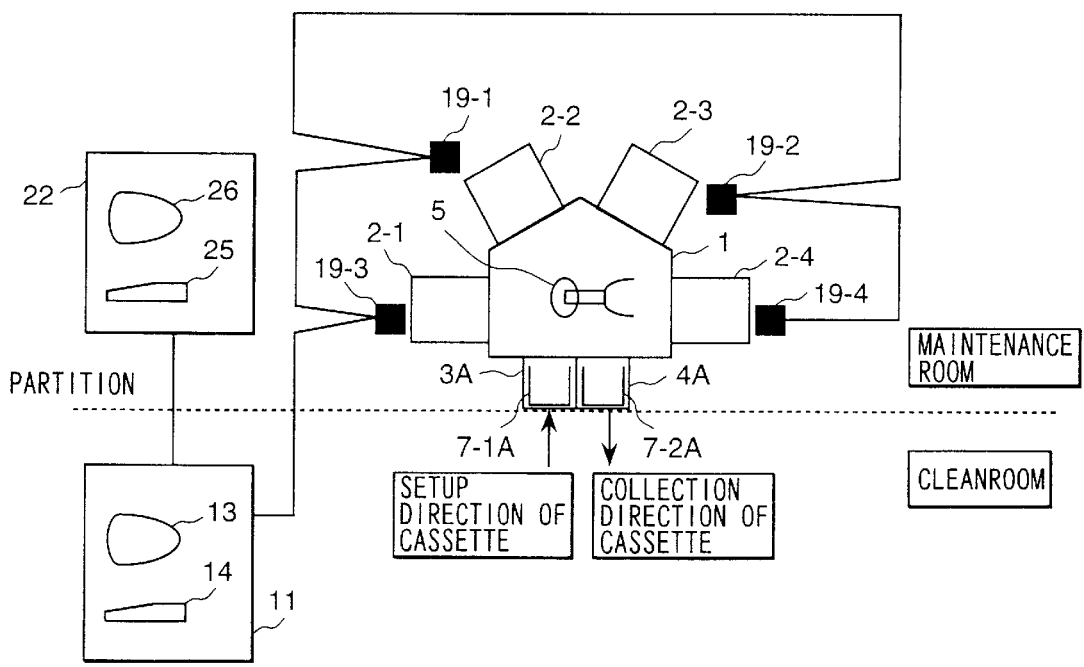
FIG. 16 is a schematic diagram showing another embodiment of vacuum processing equipment based on the present invention.

FIG. 16, which shows another embodiment of the present invention, is a diagram in which the cassette for carrying wafers into four processing units (processing chambers) connected to the transport apparatus is set in loading lock chamber 3A of each processing unit, and then, each wafer is taken out from the cassette and carried into the processing apparatus in order to undergo processing.

More than four processing units can be connected. Atmospheric transport unit 6 for setting the cassette that contains wafers, and atmospheric robot 8, both of which are included in the configuration shown in FIG. 1, are deleted from the above equipment configuration. The functions and configuration of each unit are the same as those of FIG. 1, except that the wafers within the cassette are taken out from loading lock chamber 3A and that the wafers are returned from unloading lock chamber 4A to the cassette.

During cleaning, the cassette containing the wafers for cleaning is set in loading lock chamber 3A (or unloading lock chamber 4A), then the wafers for cleaning are taken out to processing units 2-1, 2-2, 2-3, and 2-4, where each wafer is used for cleaning and is then returned to the original cassette.

The following operations modes are provided:

1) 1-cassette 1-recipe Parallel Operation

The cassette-contained wafers to undergo processing under the same conditions (recipe) are taken out from the cassette, in order with the bottom or top wafer being first, and then they are carried into the transport apparatus, and undergo processing. The wafers are processed using both route A, through which the wafers are to undergo etching in processing unit 2-2 and then after undergoing postprocessing in processing unit 2-1, these wafers are to be returned to the original cassette, and route B, through which the wafers are to undergo etching in processing unit 2-3 and then after undergoing postprocessing in processing unit 2-4, these wafers are to be returned to the original cassette.

In this embodiment, the processing sequence takes the route combination:

Route A: Cassette 7-1A inside loading lock chamber 3A→Processing unit 2-2→Processing unit 2-1 Cassette→7-2A inside unloading lock chamber 4A; and Route B: Cassette 7-1A inside loading lock chamber 3A→Processing unit 2-3→Processing unit 2-4→Cassette 7-2A inside unloading lock chamber 4A; or Route C: Cassette 7-1A inside loading lock chamber 3A→Processing unit 2-2→Processing unit 2-4→Cassette 7-2A inside unloading lock chamber 4A; and Route D: Cassette 7-1A inside loading lock chamber 3A→Processing unit 2-3→Processing unit 2-1→Cassette 7-2A inside unloading lock chamber 4A.

Also, although in the above processing sequence, processed wafers are returned to cassette 7-2A within unloading lock chamber 4A, the wafers can also be returned to cassette 7-1A within the loading lock chamber 3A from which the wafers were removed.

This example shows the processing sequence where the wafers that have been removed from cassette 7-1A within loading lock chamber 3A are to be returned to cassette 7-2A within the loading lock chamber 4A by using routes A and B in parallel. During wafer processing, each wafer undergoes processing in the sequence of the first wafer following route A, the second wafer following route B, the third wafer following route A, the fourth wafer following route B, and so on up to the last wafer. After all the wafers within cassette 7-1A of loading lock chamber 3A have undergone processing, a buzzer not shown in this figure is sounded to notify the operator that processing for the cassettes within the loading and unloading lock chambers has been completed and that the cassettes require replacement. Next, a new cassette containing unprocessed wafers is set in loading lock chamber 3A and an empty cassette is set in unloading lock chamber 4A. Hereafter, the above operation cycle is repeated. This operation cycle is completed when the operations for stopping it are performed from main control unit 11. The method of completing the operation cycle is the same as for "1-cassette 1-recipe parallel operation".

2) 2-Cassette 1-Recipe Parallel Operation

The cassette-contained wafers to undergo processing under the same conditions (hereinafter, one set of processing conditions is referred to as a recipe) are taken out from the cassette, in order with the bottom or top wafer being first, then carried into the transport apparatus, and undergo processing.

During "1-cassette 1-recipe parallel operation", after wafers have been sequentially taken out from one cassette, then transported to the transport apparatus, and have undergone processing, all the wafers within that cassette undergo processing and then the wafers within the next cassette undergo processing. During "2-cassette 1-recipe parallel operation", however, wafers are taken out alternately from cassette 7-1A within loading lock chamber 3A and cassette 7-2A within unloading lock chamber 4A, and then they are carried to the transport apparatus, and undergo processing. As with "1-cassette 1-recipe parallel operation", during 112-cassette 1-recipe parallel operation", wafers are processed using both route A, through which the wafers are to undergo etching in processing unit 2-2 and then after undergoing postprocessing in processing unit 2-1, these wafers are to be returned to the original cassette, and route B, through which the wafers are to undergo etching in processing unit 2-3 and then after undergoing postprocessing in processing unit 2-4, these wafers are to be returned to the original cassette.

The combinations of routes A and B or C and D in the processing sequence shown in this embodiment are the same as for "1-cassette 1-recipe parallel operation".

During wafer processing, each wafer within the two cassettes undergoes processing in the sequence of the 3A loading lock chamber 7-1A cassette's first wafer as the first following route A, the 4A unloading lock chamber 7-2A cassette's first wafer as the second following route B, the 3A loading lock chamber 7-1A cassette's second wafer as the third following route A, the 4A unloading lock chamber 7-2A cassette's second wafer as the fourth following route B, and so on up to the last wafer. After all the wafers within cassette 7-1A of the loading lock chamber 3A or cassette 7-2A of the unloading lock chamber 4A have undergone processing, a buzzer not shown in this figure is sounded to notify the operator that processing for the cassette within loading lock chamber 3A (or unloading lock chamber 4A) has been completed and that the cassette requires replacement.

Until this cassette has been removed and a new one set, only processing for the other cassette is continued. When a new cassette is set, wafers are taken out alternately from cassettes 7-1A and 7-2A within loading lock chamber 3A and unloading lock chamber 4A, respectively, and then they are carried to the transport apparatus, and undergo processing, as described earlier. Thereafter, the above operation cycle is repeated. This operation cycle is completed when the operations for stopping it are performed from main control unit 11. The method of completing the operation cycle is the same as for "1-cassette 1-recipe parallel operation". Also, cleaning is the same as for item 1) above.

3) 2-Cassette 2-Recipe Parallel Operation

In this operation mode, the wafer processing recipe may differ between cassette 7-1A within loading lock chamber 3A and cassette 7-2A within unloading lock chamber 4A. In this case, removal of the wafers from cassettes 7-1 and 7-2 is not alternate; this operation mode is the same as "2-cassette 1-recipe parallel operation", except that after processing in one processing unit has been finished and the wafer has been transported to the next processing unit, the next wafer is carried to the corresponding processing unit. Also, the cleaning of the corresponding wafer is the same is for item 1) above.

4) 1-Cassette 1-Recipe Serial Operation

This operation mode is the same as "1-cassette 1-recipe parallel operation" in that the cassette-contained wafers to undergo processing under the same conditions (recipe) are taken out from one cassette, in order with the bottom or top wafer being first, and then they are carried into the transport apparatus, and undergo processing. The wafer processing routes, however, differ from those of "1-cassette 1-recipe parallel operation".

In the "1-cassette 1-recipe serial operation" mode, each wafer, after undergoing etching in processing unit 2-2 (or 2-3) first and then processing unit 2-3 (or 2-2), undergoes postprocessing in processing unit 2-1 (or 2-4) and is returned to the original cassette. This processing route is referred to as route E.

This example shows the processing sequence where the wafers that have been removed from cassette 7-1A within loading lock chamber 3A via route E are returned to cassette 7-2A within unloading lock chamber 4A.

During wafer processing, each wafer undergoes processing-in the sequence of the first wafer following route E, the second wafer following route E, the third wafer following route E, the fourth wafer following route E, and so on up to the last wafer. After all the wafers within the cassette have undergone processing, a buzzer not shown in this figure is sounded to notify the operator that processing for the cassette (7-1A within loading lock chamber 3A or 7-2A within unloading lock chamber 4A) has been completed and that the cassette requires replacement. Next, a new cassette containing unprocessed wafers is set in loading lock chamber 3A and an empty cassette is set in unloading lock chamber 4A. Hereafter, the above operation cycle is repeated. This operation cycle is completed when the operations for stopping it are performed from main control unit 11. The method of completing the operation cycle is the same as for "1-cassette 1-recipe parallel operation".

As described up to now, according to the present invention, it is possible to provide a vacuum processing equipment operating method and wafer processing method by which, even if, during the operation of the vacuum processing equipment using at least two sets of processing apparatus, either processing chamber cannot be used for reasons such as trouble, the availability of the equipment can be improved using only normal processing chambers as processing routes, without being restrained by any relationship of the processing units that constitute two sets of processing apparatus.

The vacuum processing equipment operating method and wafer processing method that enable the availability of the equipment can also be provided for cleaning and aging processes.

What is claimed is:

1. A method of operating vacuum processing equipment comprising:

a surrounding atmospheric transporting apparatus capable of mounting a plurality of cassettes storing wafers under a surrounding atmosphere;

a plurality of process processing apparatus for performing a series of different processes on each of the wafers;

a transporting means constructed to be movable in an upward or downward direction so as to enable the wafers in said cassettes to be pulled out;

a chamber enabled to be changed over to either the surrounding atmosphere or a vacuum atmosphere;

a control apparatus to control pulling-out the wafers from said cassettes, transferring them through said chamber to any of said process processing apparatus, processing said wafers one by one by said process processing apparatus and recovering processed wafers into the original cassettes through said chamber; and at least two sets of wafer processing routes including a plurality of process processing apparatus for performing each of said series of different processes, and wherein each of the at least two sets of the plurality of process processing apparatus for performing said series of different processes includes a process processing unit for performing a primary wafer processing and a process processing unit for performing a secondary wafer processing, and wherein the method comprises:

performing a state judgment for each of the process processing apparatus of each set for performing each of said series of different processes, to judge whether the operation is valid or invalid, in the event that said judgment shows that the process processing apparatus for performing the secondary processing in one set of the process processing apparatus in any of said two sets is invalid for operation, only the invalid process processing apparatus for performing said secondary processing is released, two sets of wafer processing routes for performing said series of processes are reconstructed through utilization of said two sets of process processing units for performing said primary processing and another set of process processing units for performing said secondary processing, and the wafer processing is continued through utilization of said reconstructed two sets of wafer processing routes.

2. The method of operating vacuum processing equipment according to claim 1, wherein in the event that an invalid operation occurs at said process processing apparatus, judgment is performed whether or not any residual wafer is present in said process processing apparatus; and in the event that said residual wafer is present, said residual wafer is transported and recovered into the original cassette, thereafter a wafer processing route for performing said series of process processings is reconstructed and the wafer processing is continued.

3. The method of operating vacuum processing equipment according to claim 1, wherein in reconstructing the two sets of wafer processing routes, all process processing apparatuses that have been judged valid for operation are included in the reconstructing.

4. A method of operating vacuum processing equipment comprising:

a surrounding atmospheric transporting apparatus capable of mounting a plurality of cassettes storing wafers under a surrounding atmosphere;

a plurality of process processing apparatus for performing a series of different processes on each of the wafers;

a transporting means constructed to be movable in an upward or downward direction so as to enable the wafers in said cassettes to be pulled out;

a chamber enabled to be changed over to either the surrounding atmosphere or a vacuum atmosphere;

a control apparatus to control pulling-out the wafers from said cassettes, transferring them through said chamber to any of said process processing apparatus, processing said wafers one by one by said process processing apparatus and recovering processed wafers into the original cassettes through said chamber; and at least two sets of wafer processing routes including a plurality of process processing apparatus for performing each of said series of different processes, wherein each of the at least two sets of the plurality of process processing apparatus for performing said series of different processes includes a process processing unit for performing a primary wafer processing and a process processing unit for performing a secondary wafer processing, and wherein the method comprises:

performing a state judgment for each of the process processing apparatus of each set for performing each of said series of different processes, to judge whether the operation is valid or invalid, in the event that said judgment shows that the process processing apparatus for performing the primary processing in one set of the process processing apparatus in any of said two sets and the process processing apparatus for performing the secondary processing in another set of the process processing apparatus are invalid for operation, the process processing apparatus invalid for operation is released, one set of wafer processing routes for performing said series of process processings is reconstructed through utilization of one set of process processing apparatus for performing the secondary process and the process processing apparatus for performing another one set of the primary process, that has been judged valid for operation, and the wafer processing is continued through utilization of said reconstructed one set of wafer processing routes.

5. The method of operating vacuum processing equipment according to claim 4, wherein in the event that an invalid operation occurs at said process processing apparatus, judgment is performed whether or not any residual wafer is present in said process processing apparatus; and in the event that said residual wafer is present, said residual wafer is transported and recovered into the original cassette, thereafter a wafer processing route for performing said series of process processings is reconstructed and the wafer processing is continued.

6. A method of operating vacuum processing equipment comprising:

a surrounding atmospheric transporting apparatus capable of mounting a plurality of cassettes storing wafers under a surrounding atmosphere;

a plurality of process processing apparatus for performing a series of different processes on each of the wafers;

a transporting means constructed to be movable in an upward or downward direction so as to enable the wafers in said cassettes to be pulled out;

a chamber enabled to be changed over to either the surrounding atmosphere or a vacuum atmosphere;

a control apparatus to control pulling-out the wafers from said cassettes, transferring them through said chamber to any of said process processing apparatus, processing said wafers one by one by said process processing apparatus and recovering processed wafers into the original cassettes through said chamber; and at least two sets of wafer processing routes including a plurality of process processing apparatus for performing each of said series of different processes, wherein the method comprises:

performing a state judgment for each of the process processing apparatus of each set for performing each of said series of different processes, to judge whether the operation is valid or invalid;

in the event that an invalid operation occurs in said process processing apparatus, a judgment is performed whether or not a residual wafer is present in the process processing apparatus showing said invalid operation, in the event that the residual wafer is present, any one of the following (1) to (5) conditions is selected as a processing condition for said residual wafer;

(1) that the processing is continued while retrying the processing from the processing interruption time;

(2) that only the wafer kept at the process processing apparatus showing an invalid operation is processed in recipe for recovering and subsequent wafers are continued for processing in an original recipe;

(3) that the wafer kept in the process processing apparatus showing an invalid operation is unloaded and a subsequent wafer is loaded to continue its processing;

(4) that the wafer showing the invalid operation is unloaded and recovered into the original cassette, thereafter the processing route showing the invalid operation is released from an automatic operation and its processing is continued; and (5) that the operation is interrupted in a maintenance mode.

* * * * *